United States Patent
Toleno et al.

(10) Patent No.: US 10,616,999 B2
(45) Date of Patent: Apr. 7, 2020

(54) AUDIBLE SIGNAL ATTENUATING PRINTED CIRCUIT BOARD

(71) Applicant: Microsoft Technology Licensing, LLC, Redmond, WA (US)

(72) Inventors: Brian J. Toleno, Cupertino, CA (US); Marianne Elizabeth La Ford, Palo Alto, CA (US); Michael Nikkhoo, Saratoga, CA (US); Igor Markovsky, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/995,052

(22) Filed: May 31, 2018

(65) Prior Publication Data
US 2019/0373717 A1 Dec. 5, 2019

(51) Int. Cl.
| | | |
|---|---|---|
| H05K 1/02 | (2006.01) | |
| G10K 11/178 | (2006.01) | |
| H04R 25/00 | (2006.01) | |
| H05K 1/03 | (2006.01) | |
| H01G 4/232 | (2006.01) | |

(52) U.S. Cl.
CPC ......... *H05K 1/0271* (2013.01); *G10K 11/178* (2013.01); *H01G 4/2325* (2013.01); *H04R 25/45* (2013.01); *H05K 1/036* (2013.01); *G10K 2210/129* (2013.01); *G10K 2210/3026* (2013.01); *H05K 2201/10015* (2013.01); *H05K 2201/2045* (2013.01)

(58) Field of Classification Search
USPC ........................................................ 361/763
See application file for complete search history.

(56) References Cited

U.S. PATENT DOCUMENTS

| | | | |
|---|---|---|---|
| 5,552,209 A * | 9/1996 | McCutcheon | ....... H05K 1/0271 428/209 |
| 7,898,818 B2 | 3/2011 | Kehoe | |
| 9,208,774 B2 | 12/2015 | Hardell | |
| 9,287,049 B2 | 3/2016 | Ning et al. | |
| 9,596,756 B2 | 3/2017 | Rainer et al. | |
| 2014/0076621 A1* | 3/2014 | Arnold | ..................... H01G 4/01 174/260 |
| 2015/0364254 A1 | 12/2015 | Ritter et al. | |
| 2015/0367141 A1 | 12/2015 | Goetz et al. | |
| 2017/0064811 A1* | 3/2017 | Li | ......................... H01G 4/224 |

FOREIGN PATENT DOCUMENTS

DE          3210996 A1      9/1983

OTHER PUBLICATIONS

"International Search Report and Written Opinion Issued in PCT Application No. PCT/US19/032334", dated Aug. 22, 2019, 12 Pages.

* cited by examiner

*Primary Examiner* — Andargie M Aychillhum
(74) *Attorney, Agent, or Firm* — Newport IP, LLC; Scott Y. Shigeta; Tim R. Wyckoff

(57) ABSTRACT

A printed circuit board (PCB) incorporates at least one damping layer or section. The at least one damping layer is incorporated in the PCB to absorb vibrations or oscillations that may be conveyed to the PCB. Such vibrations or oscillations may be generated by one or more electrical components coupled to the PCB. The damping layer is disposed to prevent the PCB from audibly vibrating when the electrical components associated with the PCB are caused to vibrate or pulsate under a voltage load.

16 Claims, 6 Drawing Sheets

AUDIBLE SIGNAL ATTENUATING PRINTED CIRCUIT BOARD

BACKGROUND

Portable computing devices such as laptops, media players, cellular phones, head mounted displays (HMDs) etc., have become small, light and powerful. One factor contributing to this reduction in size can be attributed to the manufacturer's ability to fabricate various components of these devices in smaller and smaller sizes while in most cases increasing the power and or operating speed of such components. Another factor contributing to the reduction in size is that from a visual standpoint, users often find compact and sleek designs of consumer electronic devices more aesthetically appealing and thus, demand compact and sleek designs. The trend of smaller, lighter, more compact and powerful presents continuing challenges in the design of portable computing devices and its associated components.

Printed circuit boards (PCBs) are used in most portable computing devices. In general, a PCB accommodates the interconnection of various electrical components. For example, a plurality of transistors, capacitors, inductors, and the like, may be interconnected using a PCB. The PCB may have a plurality of vias and traces to accommodate interconnecting the various electrical components mounted to the PCB. Furthermore, the PCB may include different conductive and nonconductive dielectric layers. The conductive layers may incorporate the plurality of vias and traces, while the nonconductive or insulating dielectric layers may function to separate or isolate one or more of the conductive layers. A PCB that includes a plurality of conductive and nonconductive layers is often referred to as a multilayer PCB.

A computing device incorporating one or more PCBs may apply a voltage to the electrical components associated with the one or more PCBs. The voltage applied to the electrical components may cause the one or more of the electrical components to change shape or deform due to electrostriction. For example, a voltage may cause some of the electrical components to vibrate or pulsate. The vibration caused by the electrical components may be transmitted to the PCB and cause the PCB to vibrate. The vibration of the PCB may be undesirably audible to a user of the computing device. Human perceptible sound associated with the vibration of a PCB is particularly problematic when associated with computing devices (e.g., cell phones and HMDs) that are often used close to a user's ear.

SUMMARY

The disclosed techniques provide a printed circuit board (PCB) that incorporates at least one damping layer or section. The at least one damping layer is incorporated in the PCB to absorb vibrations or oscillations that may be conveyed to the PCB. Such vibrations or oscillations may be generated by one or more electrical components coupled to the PCB. The damping layer is disposed to prevent the PCB from audibly vibrating when the electrical components associated with the PCB are caused to vibrate or pulsate under a voltage load.

In some implementations, a PCB incorporates a plurality of layers. The layers include conductive and nonconductive layers. A vibration damping layer may be disposed between one or more of the conductive and/or nonconductive layers to absorb vibrations or oscillations transmitted to the PCB via one or more electrical components associated with the PCB.

In some implementations, a vibration damping layer may be disposed in an area of a PCB below an electrical component coupling interface associated with the PCB. For example, the vibration damping layer may be disposed below the electrical interface that includes a capacitor coupled thereto. In some implementations, the vibration damping layer may be disposed adjacent to the electrical interface.

The PCB may employ a plurality of vibration damping layers. Some of the plurality of vibration damping layers may be disposed directly below an electrical component coupling interface of the PCB, and some of the plurality of damping layers may be disposed adjacent to an electrical component coupling interface of the PCB.

A vibration damping layer associated with a PCB may comprise any material sufficient to absorb vibrations or oscillations generated by one or more electrical components coupled to the PCB. For example, the vibration damping layer may be a comprised of polymer, such as silicone, polypropylene, or polyurethane. In some implementations, the vibration damping layer may be comprised of a sheet of resin impregnated with either continuous fiber or discontinuous chopped fiber that dissipates vibrations or oscillations that may be generated by the one or more electrical components coupled to the PCB. In some implementations, the vibration damping layer may be comprised of a layer of resin that does not contain fibers or other fillers.

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter. The term "techniques," for instance, may refer to system(s), method(s), computer-readable instructions, module(s), algorithms, hardware logic, and/or operation(s) as permitted by the context described above and throughout the document.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

FIG. 4 further illustrates a PCB at various stages of manufacture.

DETAILED DESCRIPTION

The disclosed techniques provide a printed circuit board (PCB) that incorporates at least one damping layer or section. The at least one damping layer is incorporated in the PCB to absorb vibrations or oscillations that may be conveyed to the PCB. Such vibrations or oscillations may be generated by one or more electrical components coupled to the PCB. The damping layer is disposed to prevent the PCB from audibly vibrating when the electrical components associated with the PCB are caused to vibrate or pulsate under a voltage load.

In some implementations, a PCB incorporates a plurality of layers. The layers include conductive and nonconductive layers. A vibration damping layer may be disposed between one or more of the conductive and/or nonconductive layers to absorb vibrations or oscillations transmitted to the PCB via one or more electrical components associated with the PCB.

In some implementations, a vibration damping layer may be disposed in an area of a PCB below an electrical component coupling interface associated with the PCB. For example, the vibration damping layer may be disposed below the electrical interface that includes a capacitor coupled thereto. In some implementations, the vibration damping layer may be disposed adjacent to the electrical interface.

The PCB may employ a plurality of vibration damping layers. One or more of the plurality of vibration damping layers may be disposed directly below an electrical component coupling interface of the PCB, and one or more of the plurality of damping layers may be disposed adjacent to an electrical component coupling interface of the PCB.

A vibration damping layer associated with a PCB may comprise any material sufficient to absorb vibrations or oscillations generated by one or more electrical components coupled to the PCB. For example, the vibration damping layer may be a comprised of polymer, such as silicone, polypropylene, or polyurethane. In some implementations, the vibration damping layer may be comprised of a sheet of resin impregnated with either continuous fiber or discontinuous chopped fiber that dissipates vibrations or oscillations that may be generated by the one or more electrical components coupled to the PCB. In some implementations, the vibration damping layer may be comprised of a layer of resin that does not contain fibers or other fillers.

Various examples, implementations, scenarios, and aspects are described below with reference to FIGS. 1 through 6.

Figure 1:
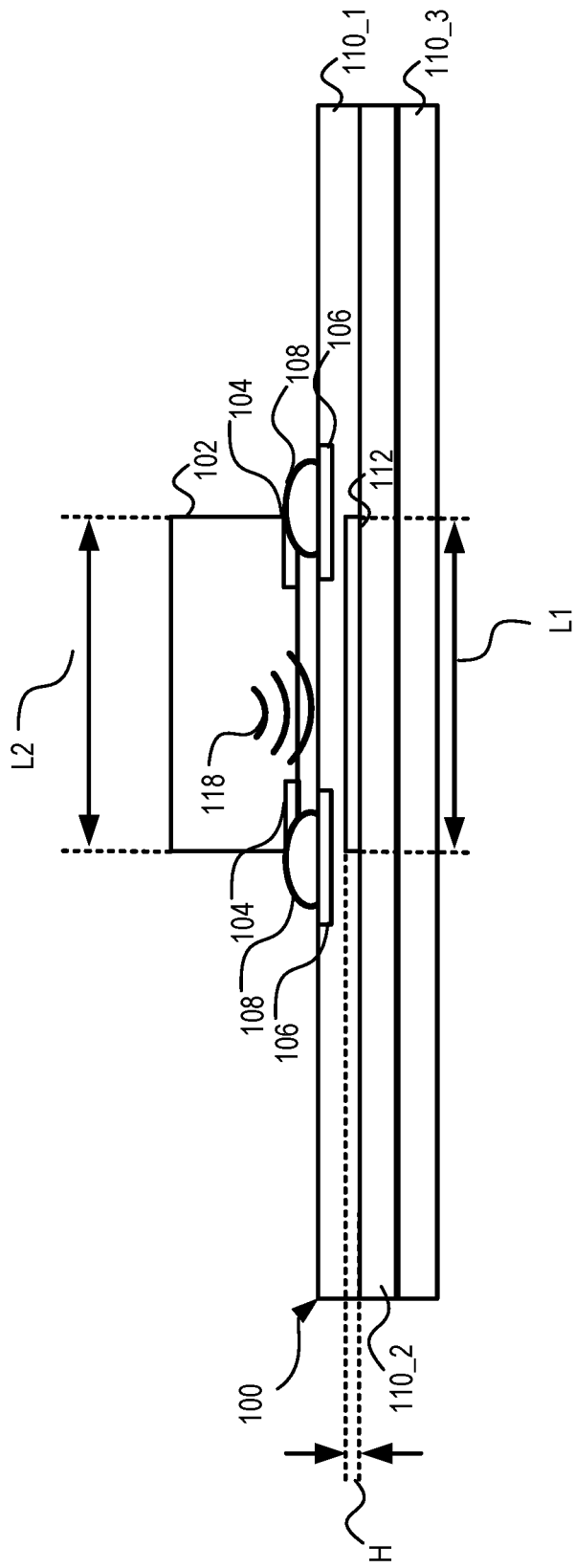
FIG. 1 is cross sectional view of a printed circuit board (PCB) 100 that includes vibration damping properties, in accordance with one or more exemplary implementations.

FIG. 1 is cross sectional view of a printed circuit board (PCB) 100 that includes vibration damping properties, in accordance with one or more exemplary implementations. The PCB 100 may include at least one electrical component 102 coupled thereto. In some implementations, the electrical component 102 is a capacitor. The capacitor may be any known type of capacitor. In some implementations, the capacitor is a ceramic capacitor. For example, the capacitor may be a multilayer ceramic capacitor. The PCB 100 may include a plurality of electrical components coupled thereto.

The electrical component 102 may include a plurality of electrical terminals 104. The plurality of electrical terminals 104 may couple the electrical component 102 to the PCB 100. For example, the plurality of electrical terminals 104 may couple to electrical component interfaces 106 associated with the PCB 100. The electrical component interfaces 106 may be PCB contact pads. Solder 108 may be used to couple the plurality of electrical terminals 104 to the electrical component interfaces 106.

The PCB 100 may comprise a plurality of PCB layers 110 (e.g., PCB layers 110_1-110_3). The PCB layers 110 may include dielectric layers, conductive layers, nonconductive layers, and the like. In some implementations, at least one or more of the PCB layers 110 is a glass fiber layer. Furthermore, in some implementations, at least one or more of the PCB layers 110 comprises gold, silver, and/or copper. In some implementations, the PCB 100 may comprise one or more vias (not illustrated in FIG. 1).

One or more electrical components, such as the electrical component 102, may change shape or deform due to electrostriction. For example, the electrical component 102 may vibrate or pulsate 118 when a voltage is applied thereto. The vibration 118 from the electrical component 102 may be transmitted to the PCB 100. The transmitted vibration 118 from the electrical component 102 may cause the PCB 100 to vibrate.

In some scenarios, the vibration associated with the PCB 100 is audible to a user of a device containing the PCB 100. For example, the PCB 100 may be associated with a computing device, such as a laptop computer, mobile device, head mounted display (HMD), or the like. Audible vibrations associated with the PCB 100 may be undesirable to the user of the computing device. Particularly, audible vibrations associated with the PCB 100 may be highly undesirable to a user of a computing device (e.g., HMD) that may be used in close proximity to an ear of the user.

A vibration damping layer 112 may be associated with the PCB 100. The vibration damping layer 112 is disposed as part of the PCB 100 to absorb vibrations 118 conveyed to the PCB 100 from one or more of the electrical components 102.

In some implementations, the vibration damping layer 112 comprises at least one of silicone, polypropylene, and polyurethane. Furthermore, in some implementations, the vibration damping layer 112 comprises a woven fiber cloth impregnated with a resin. In some implementations, the vibration damping layer 112 comprises the resin. The resin may include continuous or discontinuous fibers.

The vibration damping layer 112 may absorb a sufficient amount of the vibrations 118 conveyed to the PCB 100 from one or more of the electrical components 102, to thereby prevent the PCB 100 from producing vibrations audible to a user of the PCB 100. In some implementations, the vibration damping layer 112 has a height H that is between 0.1 mm and 0.5 mm. A height H falling in the indicated range has been found to efficiently mitigate audible vibrations associated with the PCB 100, while at the same time allowing manufacture of the PCB 100 without having to increase a height and/or width of the PCB 100.

In some implementations, the vibration damping layer 112 is disposed below the electrical component 102. Specifically, the vibration damping layer 112 may have a length L1 that is equal or substantially equal to a length L2 of the electrical component 102. In some implementations, a vibration damping layer portion of the vibration damping layer 112 may at least partially overlap an electrical terminal portion of one or more of the electrical terminals 104. In addition, the vibration damping layer 112 may be disposed over the PCB layer 110_2, such that the vibration damping layer 112 is in close proximity to the electrical component 102. The arrangement illustrated in FIG. 1 may provide optimum vibration damping properties for the PCB 100.

The PCB 100 may include, as described, a plurality of electrical components 102 coupled to the PCB 100. The PCB 100 may include a vibration damping layer 112 disposed below each of the plurality of electrical components 102, in a similar manner as illustrated in FIG. 1.

In some implementations, the vibration damping layer 112 is in the form of a patch applied to at least one of the PCB layers 110 of the PCB 100. Specifically, the vibration damping layer 112 in the form of a patch may be applied on a surface of the PCB layer 110_2 prior to disposing the PCB layer 110_1 over the PCB layers 110_2 and 110_3.

Figure 2:
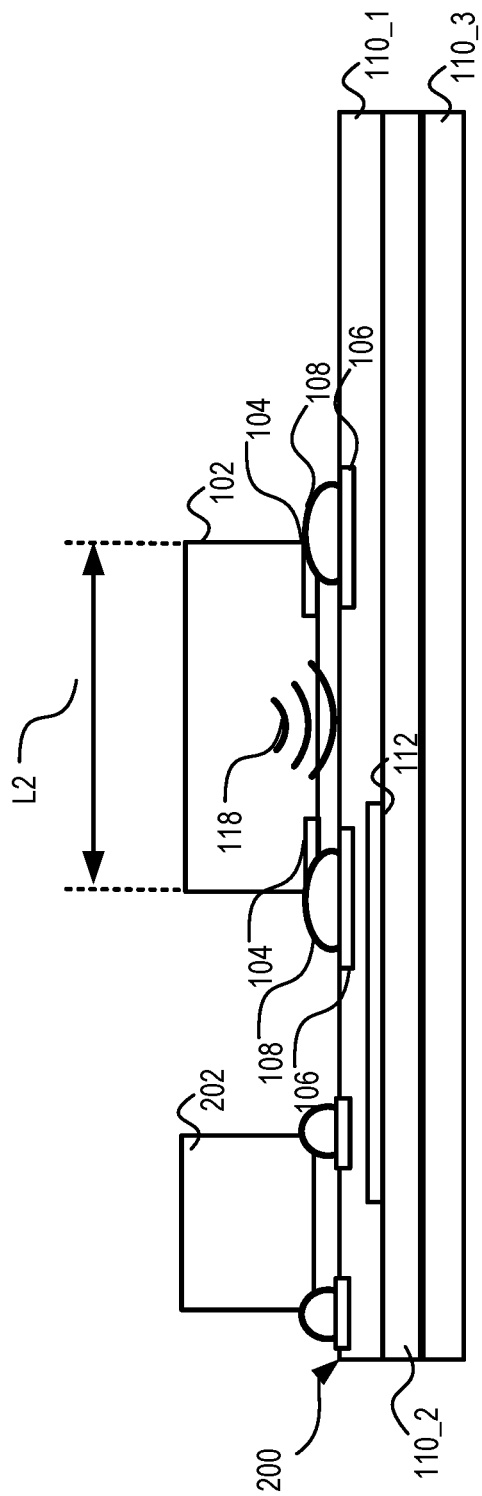
FIG. 2 is cross sectional view of a PCB that includes vibration damping properties, in accordance with one or more exemplary implementations.

FIG. 2 is cross sectional view of a PCB 200 that includes vibration damping properties, in accordance with one or more exemplary implementations. The PCB 200 includes the vibration damping layer 112. The vibration damping layer 112 may at least partially overlap the length 116 of the electrical component 102. In some implementations, a portion of vibration damping layer of the vibration damping layer 112 may at least partially overlap an electrical terminal portion associated with at least one of the electrical terminals 104. The arrangement illustrated in FIG. 2 may be particularly advantageous when a second electrical component 202 is arranged in close proximity to the electrical component 102. Specifically, the arrangement of the vibration damping layer 112, as illustrated in FIG. 2, functions to absorb vibrations that may be generated by each of the electrical components 102 and 202.

Figure 3:
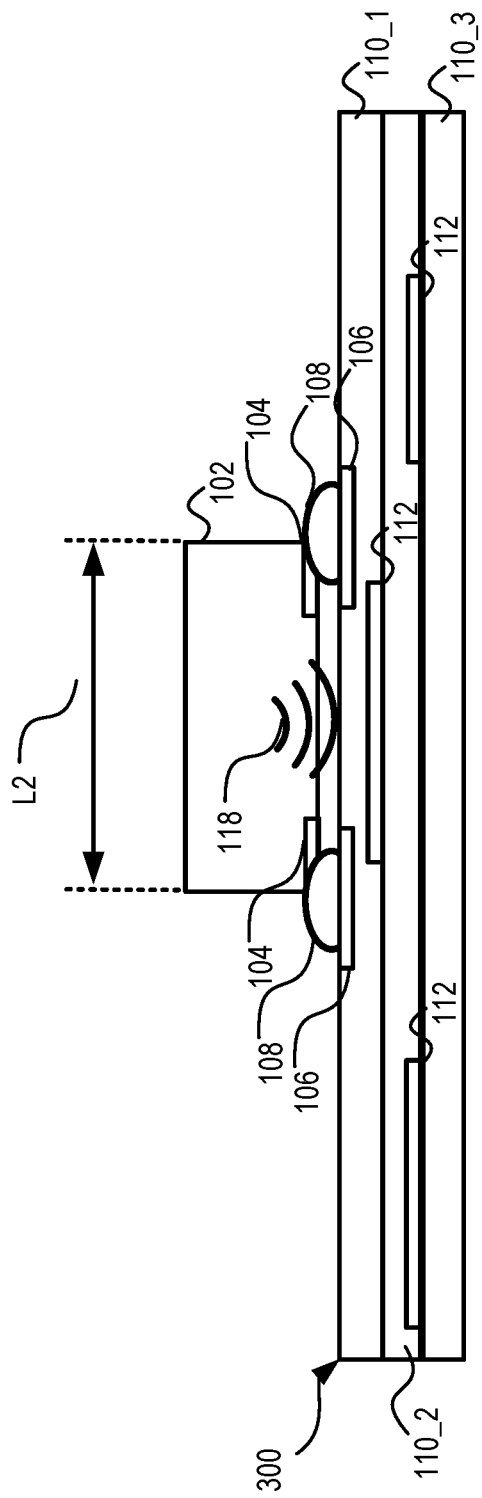
FIG. 3 is cross sectional view of a PCB that includes vibration damping properties, in accordance with one or more exemplary implementations.

FIG. 3 is cross sectional view of a PCB 300 that includes vibration damping properties, in accordance with one or more exemplary implementations. The PCP 300 includes a plurality of the vibration damping layers 112. Specifically, as illustrated, a first vibration damping layer 112 is disposed above the PCB layer 110_2. Furthermore, a plurality of additional vibration dampening layers 112 is disposed above the PCB layer 110_3. The use of the plurality of the vibration damping layers 112 may further enhance the vibration damping properties associated with the PCB 300.

As should be readily understood by this disclosure, the PCBs 100, 200 and 300 may implement any number of vibration damp damping layers 112.

Figure 4:
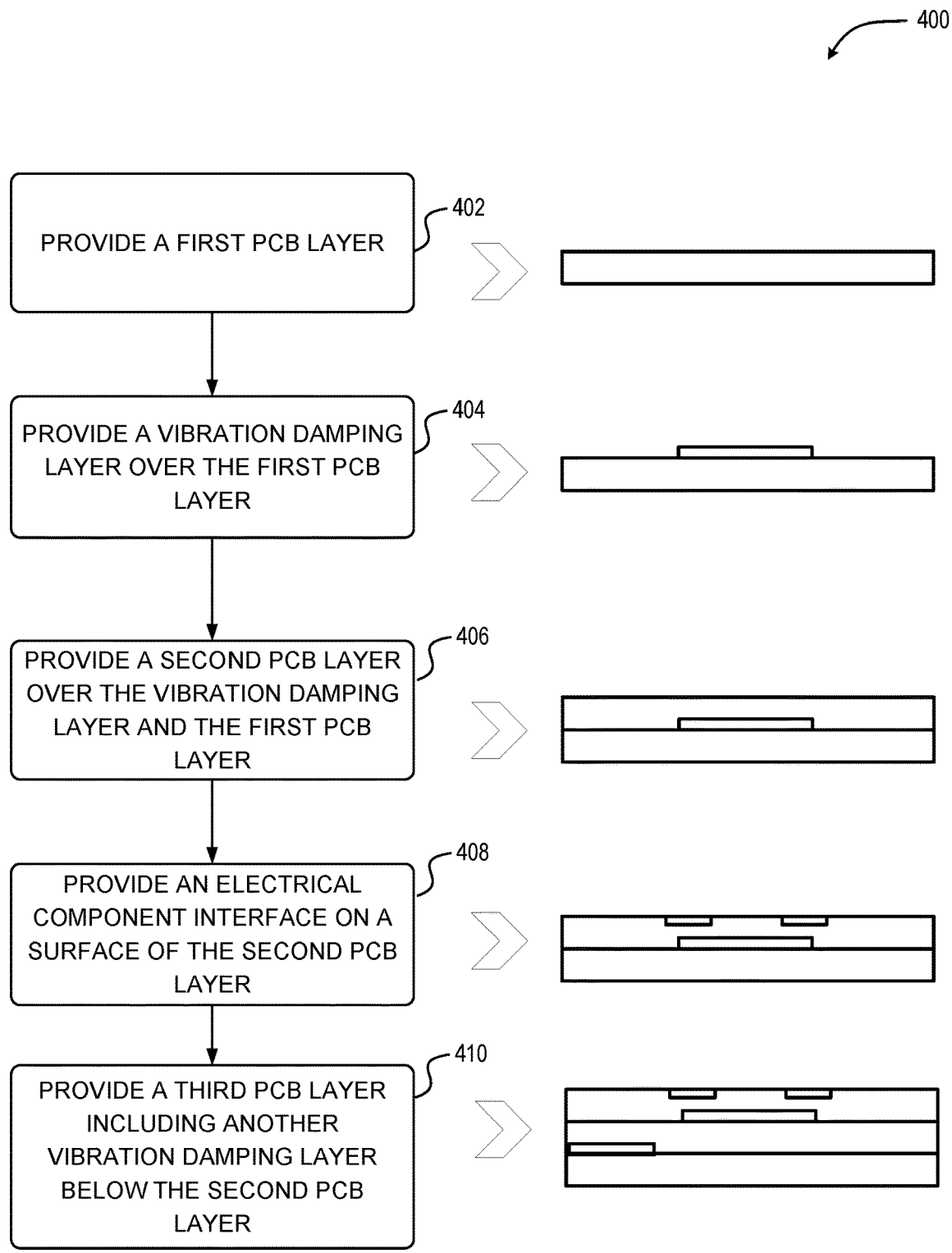
FIG. 4 includes a diagram of an example flowchart that illustrates operations associated with manufacturing at least one of the disclosed PCBs.

FIG. 4 includes a diagram of an example flowchart 400 that illustrates operations associated with manufacturing the PCBs 100, 200 and/or 300. FIG. 4 further illustrates the PCBs 100, 200 and/or 300 at various stages of manufacture. In one example, the operations of FIG. 4 may be performed by components of one or more known exemplary systems to manufacture PCBs. Such known exemplary systems are able to arrange and bond PCB layers using known techniques. Such known techniques to arrange and bond PCB layers include coupling various PCB layers at room temperature using epoxy or other bonding material. In other implementations, known techniques to arrange and bond PCB layers include coupling various PCB layers at temperatures that are higher than room temperature. A PCB with bonded layers may then be patterned, drilled and/or stacked to accommodate any connection or electrical component type. Furthermore, vias may be created in the PCB after the PCB layer bonding process.

Turning to FIG. 4, a first PCB layer is provided at operation 402. For example, the first PCB layer may be the PCB layer 110_2.

At operation 404, a vibration damping layer is provided over the first PCB layer. For example, the vibration damping layer may be the vibration damping layer 112.

At operation 406, a second PCB layer is provided over the vibration damping layer and the first PCB layer. For example, the second PCB layer may be the PCB layer 110_1.

At operation 408, an electrical component interface is provided on a surface of the second PCB layer. For example, the electrical component interface may comprise the electrical component interfaces 106.

At operation 410, a third PCB layer including another vibration damping layer disposed on a surface thereof is provided below the second PCB layer. For example, the third PCB layer may comprise the PCB layer 110_3 and another vibration damping layer may comprise the vibration damping layer 112 disposed on a surface of the PCB layer 110_3.

An electrical component, such as the electrical component 102, may be coupled to the electrical component interface provided at the operation 408.

Figure 5:
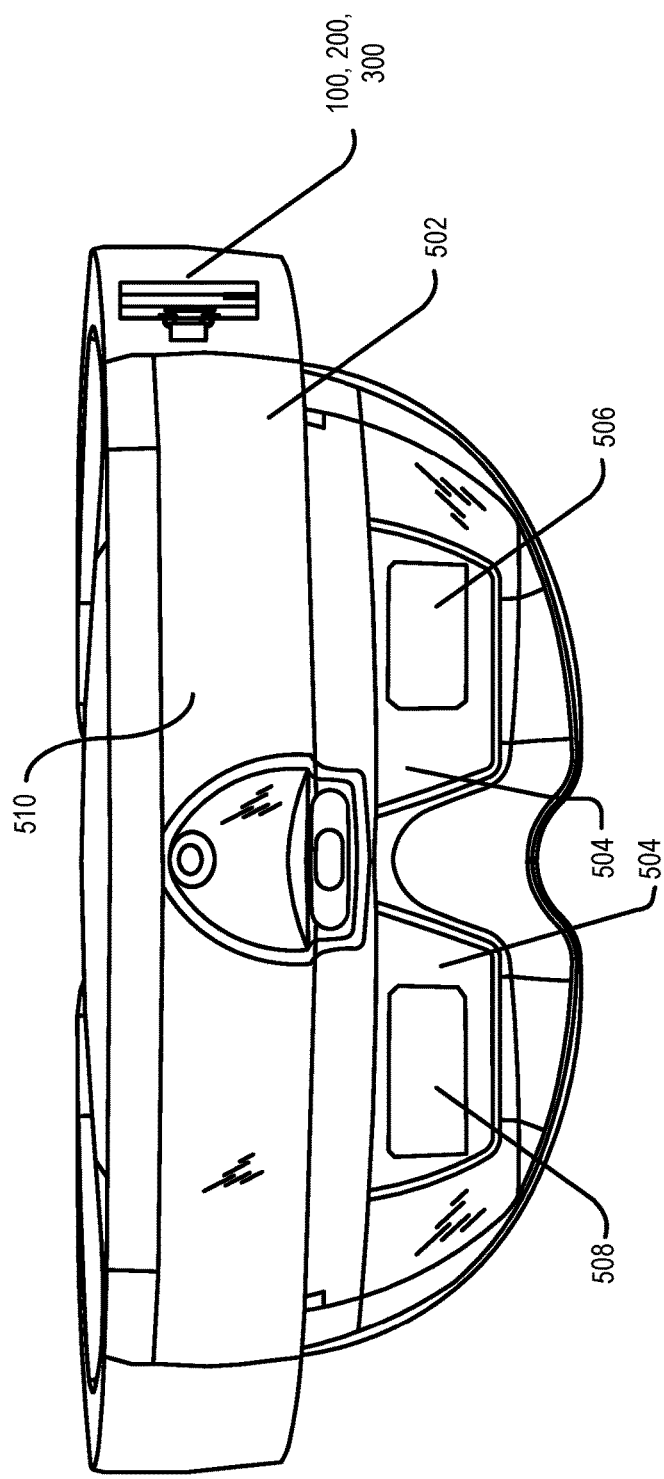
FIG. 5 is a front-view of an example of an implementation of an exemplary computing device that may implement one or more of the disclosed PCBs.

FIG. 5 is a front-view of an example of an implementation of an exemplary computing device that may implement one or more of the disclosed PCBs 100, 200, and 300. Specifically, FIG. 5 illustrates a front-view of an example implementation of a mixed reality HMD 500 that may implement one or more of the disclosed PCBs 100, 200, and/or 300. In this example, the HMD 500 includes a body 502, transparent visor 504, and first optical payload 506 and a second optical payload 508.

A vibration suppressing PCB, such as the disclosed PCBs 100, 200, and/or 300, is particularly advantageous when implemented in the HMD 500. In particular, the HMD 500 is worn in close proximity to a user's ears. Therefore, suppression of audible vibrations that may be generated by a PCB and one or more electrical components coupled thereto is necessary to optimize a user's use and enjoyment of the HMD 500.

Figure 6:
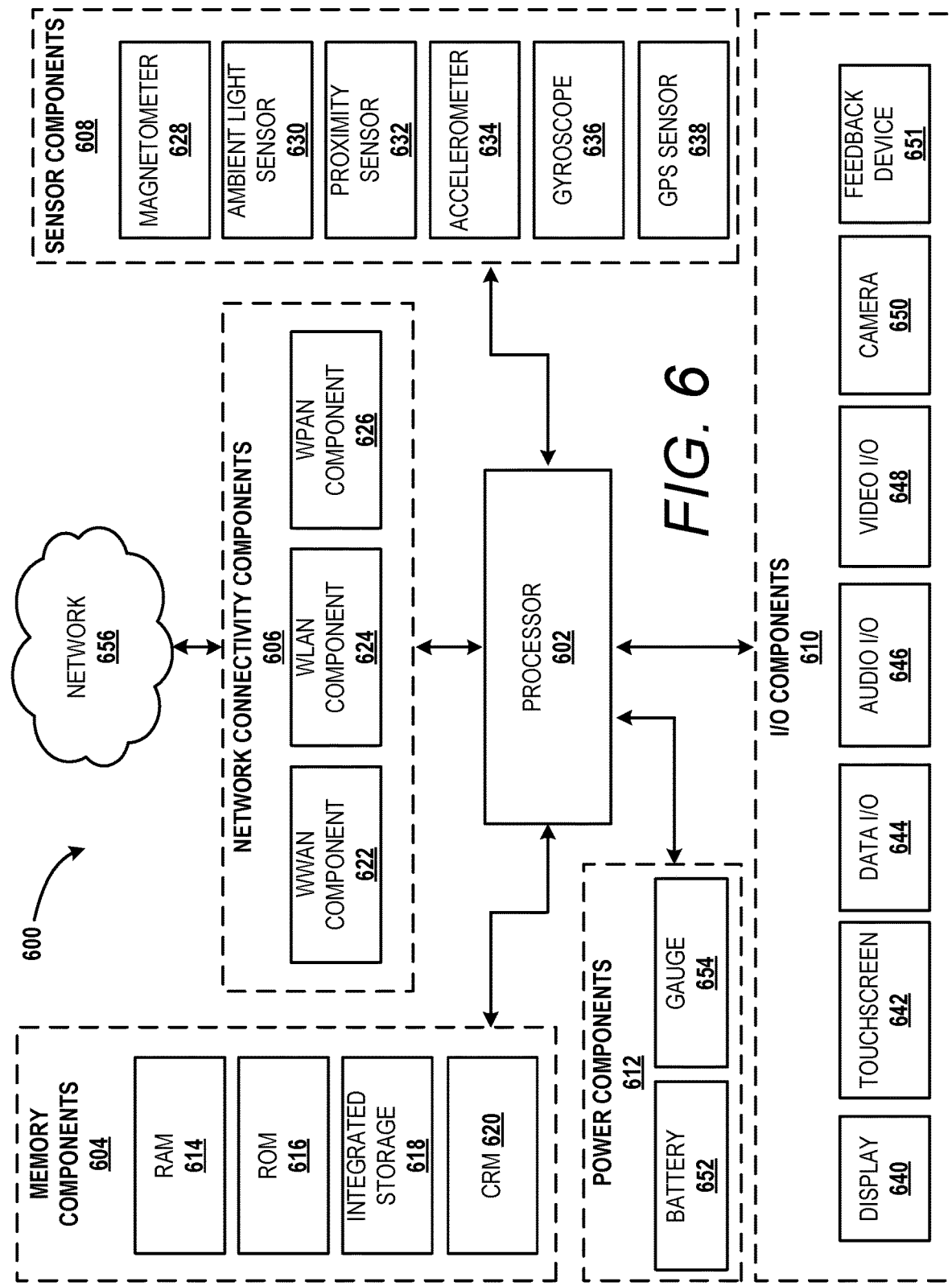
FIG. 6 illustrates a computer architecture diagram illustrating an illustrative hardware and software architecture that may use one or more of the disclosed PCBs.

Turning now to FIG. 6, an illustrative computing device architecture 600 for computing devices that may implement the exemplary PCBs described herein is provided. The computing device architecture 600 is applicable to computing devices that facilitate mobile computing due, in part, to form factor, wireless connectivity, and/or battery-powered operation. In some configurations, the computing devices include, but are not limited to, digital pens, digital inking devices, mobile telephones, tablet devices, slate devices, portable video game devices, and the like.

The computing device architecture 600 may implement any of the devices and structures shown in the accompanying figures. Moreover, aspects of the computing device architecture 600 may be applicable to traditional desktop computers, portable computers, e.g., phones, laptops, notebooks, ultra-portables, and netbooks, server computers, and other computer systems, such as those described herein. For example, the single touch and multi-touch aspects disclosed herein below may be applied to desktop computers that utilize a touchscreen or some other touch-enabled device, such as a touch-enabled track pad or touch-enabled mouse. In some implementations, some or all of the computer device architecture 600 implements one or more of the exemplary devices or structures (e.g., PCBs) described herein.

The computing device 600 illustrated in FIG. 6 includes a processor 602, memory components 604, network connectivity components 606, sensor components 608, input/output components 610, and power components 612. In the illustrated configuration, the processor 602 is in communication with the memory components 604, the network connectivity components 606, the sensor components 608, the input/output ("I/O") components 610, and the power components 612. Although no connections are shown between the individual components illustrated in FIG. 6, the components can interact to carry out device functions. In some configurations, the components are arranged so as to communicate via one or more busses (not shown on FIG. 6).

The processor 602 includes a central processing unit ("CPU") configured to process data, execute computer-executable instructions of one or more application programs, and communicate with other components of the computing device architecture 600 in order to perform various functionality described herein. The processor 602 may be utilized to execute aspects of the software components presented herein and, particularly, those that utilize, at least in part, a touch-enabled input.

In some configurations, the processor 602 includes a graphics processing unit ("GPU") (not shown on FIG. 6) configured to accelerate operations performed by the CPU, including, but not limited to, operations performed by executing general-purpose scientific and/or engineering computing applications, as well as graphics-intensive computing applications such as high resolution video (e.g., 720P, 1080P, and higher resolution), video games, three-dimensional ("3D") modeling applications, and the like. In some configurations, the processor 602 is configured to communicate with a discrete GPU (not shown on FIG. 6). In any case, the CPU and GPU may be configured in accordance with a co-processing CPU/GPU computing model, wherein the sequential part of an application executes on the CPU and the computationally-intensive part is accelerated by the GPU.

In some configurations, the processor 602 is, or is included in, a system-on-chip ("SoC") (not shown on FIG. 6) along with one or more of the other components described herein below. For example, the SoC may include the processor 602, a GPU, one or more of the network connectivity components 606, and one or more of the sensor components 608. In some configurations, the processor 602 is fabricated in part utilizing a package-on-package ("PoP") integrated circuit packaging technique. The processor 602 may be a single core or multi-core processor.

The processor 602 may be created in accordance with an ARM architecture, available for license from ARM HOLDINGS of Cambridge, United Kingdom. Alternatively, the processor 602 may be created in accordance with an x86 architecture, such as is available from INTEL CORPORATION of Mountain View, Calif. and others. In some configurations, the processor 602 is a SNAPDRAGON SoC, available from QUALCOMM of San Diego, Calif., a TEGRA SoC, available from NVIDIA of Santa Clara, Calif., a HUMMINGBIRD SoC, available from SAMSUNG of Seoul, South Korea, an Open Multimedia Application Platform ("OMAP") SoC, available from TEXAS INSTRUMENTS of Dallas, Tex., a customized version of any of the above SoCs, or a proprietary SoC.

The memory components 604 include a random-access memory ("RAM") 614, a read-only memory ("ROM") 616, an integrated storage memory ("integrated storage") 618, and a computer readable medium ("CRM") 620. In some configurations, the RAM 614 or a portion thereof, the ROM 616 or a portion thereof, and/or some combination of the RAM 614 and the ROM 616 is integrated in the processor 602. In some configurations, the ROM 616 is configured to store a firmware, an operating system or a portion thereof (e.g., operating system kernel), and/or a bootloader to load an operating system kernel from the integrated storage 618 and/or the CRM 620.

The integrated storage 618 can include a solid-state memory, a hard disk, or a combination of solid-state memory and a hard disk. The integrated storage 618 may be soldered or otherwise connected to a logic board upon which the processor 602 and other components described herein also may be connected. As such, the integrated storage 618 is integrated in the computing device. The integrated storage 618 is configured to store an operating system or portions thereof, application programs, data, and other software components described herein.

The computer-readable media (CRM) 620 can include a solid-state memory, a hard disk, or a combination of solid-state memory and a hard disk. In some configurations, the CRM 620 is provided in lieu of the integrated storage 618. In other configurations, the CRM 620 is provided as additional optional storage. In some configurations, the CRM 620 is logically combined with the integrated storage 618 such that the total available storage is made available as a total combined storage capacity. In some configurations, the total combined capacity of the integrated storage 618 and the CRM 620 is shown to a user instead of separate storage capacities for the integrated storage 618 and the removable storage 620.

As used herein, computer-readable media can store instructions executable by the processing unit(s) 602. Computer-readable media can also store instructions executable by external processing units such as by an external CPU, an external GPU, and/or executable by an external accelerator, such as an FPGA type accelerator, a DSP type accelerator, or any other internal or external accelerator. In various examples, at least one CPU, GPU, and/or accelerator is incorporated in a computing device, while in some examples one or more of a CPU, GPU, and/or accelerator is external to a computing device.

Computer-readable media can include computer storage media and/or communication media. Computer storage media can include one or more of volatile memory, non-volatile memory, and/or other persistent and/or auxiliary computer storage media, removable and non-removable computer storage media implemented in any method or technology for storage of information such as computer-readable instructions, data structures, program modules, or other data. Thus, computer storage media includes tangible and/or physical forms of media included in a device and/or hardware component that is part of a device or external to a device, including but not limited to random access memory ("RAM"), static random-access memory ("SRAM"), dynamic random-access memory ("DRAM"), phase change memory ("PCM"), read-only memory ("ROM"), erasable programmable read-only memory ("EPROM"), electrically erasable programmable read-only memory ("EEPROM"), flash memory, rotating media, optical cards or other optical storage media, magnetic storage, magnetic cards or other magnetic storage devices or media, solid-state memory devices, storage arrays, network attached storage, storage area networks, hosted computer storage or any other storage memory, storage device, and/or storage medium that can be used to store and maintain information for access by a computing device.

In contrast to computer storage media, communication media can embody computer-readable instructions, data structures, program modules, or other data in a modulated data signal, such as a carrier wave, or other transmission mechanism. As defined herein, computer storage media does not include communication media. That is, computer storage media does not include communications media consisting solely of a modulated data signal, a carrier wave, or a propagated signal, per se.

Although the various configurations have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter. The claimed subject matter may be embodied in other ways, may include different elements or operations, and may be used in conjunction with other existing or future technologies. This description should not be interpreted as implying any particular order or arrangement among or between various operations or elements except when the order of individual operations or arrangement of elements is explicitly described.

It can be understood that one or more of the memory components 604 can store an operating system. According to various configurations, the operating system includes, but is not limited to WINDOWS MOBILE OS from Microsoft Corporation of Redmond, Wash., WINDOWS PHONE OS from Microsoft Corporation, WINDOWS from Microsoft Corporation, PALM WEBOS from Hewlett-Packard Company of Palo Alto, Calif., BLACKBERRY OS from Research In Motion Limited of Waterloo, Ontario, Canada, IOS from Apple Inc. of Cupertino, Calif., and ANDROID OS from Google Inc. of Mountain View, Calif. Other operating systems are contemplated.

The network connectivity components 606 include a wireless wide area network component ("WWAN component") 622, a wireless local area network component ("WLAN component") 624, and a wireless personal area network component ("WPAN component") 626. The network connectivity components 606 facilitate communications to and from the network 656 or another network, which may be a WWAN, a WLAN, or a WPAN. Although only the network 656 is illustrated, the network connectivity components 606 may facilitate simultaneous communication with multiple networks, including the networks referred to in any description herein. For example, the network connectivity components 606 may facilitate simultaneous communications with multiple networks via one or more of a WWAN, a WLAN, or a WPAN.

The network 656 may be or may include a WWAN, such as a mobile telecommunications network utilizing one or more mobile telecommunications technologies to provide voice and/or data services to a computing device utilizing the computing device architecture 600 via the WWAN component 622. The mobile telecommunications technologies can include, but are not limited to, Global System for Mobile communications ("GSM"), Code Division Multiple Access ("CDMA") ONE, CDMA7000, Universal Mobile Telecommunications System ("UMTS"), Long Term Evolution ("LTE"), and Worldwide Interoperability for Microwave Access ("WiMAX"). Moreover, the network 656 may utilize various channel access methods (which may or may not be used by the aforementioned standards) including, but not limited to, Time Division Multiple Access ("TDMA"), Frequency Division Multiple Access ("FDMA"), CDMA, wideband CDMA ("W-CDMA"), Orthogonal Frequency Division Multiplexing ("OFDM"), Space Division Multiple Access ("SDMA"), and the like. Data communications may be provided using General Packet Radio Service ("GPRS"), Enhanced Data rates for Global Evolution ("EDGE"), the High-Speed Packet Access ("HSPA") protocol family including High-Speed Downlink Packet Access ("HSDPA"), Enhanced Uplink ("EUL") or otherwise termed High-Speed Uplink Packet Access ("HSUPA"), Evolved HSPA ("HSPA+"), LTE, and various other current and future wireless data access standards. The network 656 may be configured to provide voice and/or data communications with any combination of the above technologies. The network 656 may be configured to or adapted to provide voice and/or data communications in accordance with future generation technologies.

In some configurations, the WWAN component 622 is configured to provide dual-multi-mode connectivity to the network 656. For example, the WWAN component 622 may be configured to provide connectivity to the network 656, wherein the network 656 provides service via GSM and UMTS technologies, or via some other combination of technologies. Alternatively, multiple WWAN components 622 may be utilized to perform such functionality, and/or provide additional functionality to support other non-compatible technologies (i.e., incapable of being supported by a single WWAN component). The WWAN component 622 may facilitate similar connectivity to multiple networks (e.g., a UMTS network and an LTE network).

The network 656 may be a WLAN operating in accordance with one or more Institute of Electrical and Electronic Engineers ("IEEE") 802.11 standards, such as IEEE 802.11a, 802.11b, 802.11g, 802.11n, and/or future 802.11 standard (referred to herein collectively as WI-FI). Draft 802.11 standards are also contemplated. In some configurations, the WLAN is implemented utilizing one or more wireless WI-FI access points. In some configurations, one or more of the wireless WI-FI access points are another computing device with connectivity to a WWAN that is functioning as a WI-FI hotspot. The WLAN component 624 is configured to connect to the network 656 via the WI-FI access points. Such connections may be secured via various encryption technologies including, but not limited to, WI-FI Protected Access ("WPA"), WPA2, Wired Equivalent Privacy ("WEP"), and the like.

The network 656 may be a WPAN operating in accordance with Infrared Data Association ("IrDA"), BLUETOOTH, wireless Universal Serial Bus ("USB"), Z-Wave, ZIGBEE, or some other short-range wireless technology. In some configurations, the WPAN component 626 is configured to facilitate communications with other devices, such as peripherals, computers, or other computing devices via the WPAN. For instance, all digital inking devices 100 disclosed herein can be in communication with a paired computer 101 via a BLUETOOTH connection, a WI-FI connection, WI-FI DIRECT connection, etc.

The sensor components 608 include a magnetometer 628, an ambient light sensor 630, a proximity sensor 632, an accelerometer 634, a gyroscope 636, and a Global Positioning System sensor ("GPS sensor") 638. It is contemplated that other sensors, such as, but not limited to, temperature sensors or shock detection sensors, also may be incorporated in the computing device architecture 600.

The magnetometer 628 is configured to measure the strength and direction of a magnetic field. In some configurations the magnetometer 628 provides measurements to a compass application program stored within one of the memory components 604 in order to provide a user with accurate directions in a frame of reference including the cardinal directions, north, south, east, and west. Similar measurements may be provided to a navigation application program that includes a compass component. Other uses of measurements obtained by the magnetometer 628 are contemplated.

The ambient light sensor 630 is configured to measure ambient light. In some configurations, the ambient light sensor 630 provides measurements to an application program stored within one the memory components 604 in order to automatically adjust the brightness of a display (described below) to compensate for low-light and high-light environments. Other uses of measurements obtained by the ambient light sensor 630 are contemplated.

The proximity sensor 632 is configured to detect the presence of an object or thing in proximity to the computing device without direct contact. In some configurations, the proximity sensor 632 detects the presence of a user's body (e.g., the user's face) and provides this information to an application program stored within one of the memory components 604 that utilizes the proximity information to enable or disable some functionality of the computing device. For example, a telephone application program may automatically disable a touchscreen (described below) in response to receiving the proximity information so that the user's face does not inadvertently end a call or enable/disable other functionality within the telephone application program during the call. Other uses of proximity information as detected by the proximity sensor 632 are contemplated.

The accelerometer 634 is configured to measure proper acceleration. In some configurations, output from the accelerometer 634 is used by an application program as an input mechanism to control some functionality of the application program. For example, the application program may be a video game in which a character, a portion thereof, or an object is moved or otherwise manipulated in response to input received via the accelerometer 634. In some configurations, output from the accelerometer 634 is provided to an application program for use in switching between landscape and portrait modes, calculating coordinate acceleration, or detecting a fall. Other uses of the accelerometer 634 are contemplated.

The gyroscope 636 is configured to measure and maintain orientation. In some configurations, output from the gyroscope 636 is used by an application program as an input mechanism to control some functionality of the application program. For example, the gyroscope 636 can be used for accurate recognition of movement within a 3D environment of a video game application or some other application. In some configurations, an application program utilizes output from the gyroscope 636 and the accelerometer 634 to enhance control of some functionality of the application program. Other uses of the gyroscope 636 are contemplated.

The GPS sensor 638 is configured to receive signals from GPS satellites for use in calculating a location. The location calculated by the GPS sensor 638 may be used by any application program that requires or benefits from location information. For example, the location calculated by the GPS sensor 638 may be used with a navigation application program to provide directions from the location to a destination or directions from the destination to the location. Moreover, the GPS sensor 638 may be used to provide location information to an external location-based service, such as E911 service. The GPS sensor 638 may obtain location information generated via WI-FI, WIMAX, and/or cellular triangulation techniques utilizing one or more of the network connectivity components 606 to aid the GPS sensor 638 in obtaining a location fix. The GPS sensor 638 may also be used in Assisted GPS ("A-GPS") systems. The GPS sensor 638 can also operate in conjunction with other components, such as the processor 602, to generate positioning data for the computing device 600.

The I/O components 610 include a display 640, a touchscreen 642, a data I/O interface component ("data I/O") 644, an audio I/O interface component ("audio I/O") 646, a video I/O interface component ("video I/O") 648, and a camera 650. In some configurations, the display 640 and the touchscreen 642 are combined. In some configurations two or more of the data I/O component 644, the audio I/O component 646, and the video I/O component 648 are combined. The I/O components 610 may include discrete processors configured to support the various interfaces described below, or may include processing functionality built-in to the processor 602.

In some configurations, the computing device 600 can include feedback device 651, such as an actuator or solid-state circuit configured to physically vibrate in response to a haptic signal. The processing units can cause the generation of a haptic signal associated with a generated haptic effect to feedback device 651, which in turn outputs haptic effects such as vibrotactile haptic effects, electrostatic friction haptic effects, or deformation haptic effects.

The feedback device 651 includes a drive circuit. The feedback device 651 may be, for example, an electric motor, an electro-magnetic actuator, a voice coil, a shape memory alloy, an electro-active polymer, a solenoid, an eccentric rotating mass motor ("ERM"), a linear resonant actuator ("LRA"), a piezoelectric actuator, a high bandwidth actuator, an electroactive polymer ("EAP") actuator, an electrostatic friction display, or an ultrasonic vibration generator. In alternate embodiments, computing device 600 can include one or more feedback devices 651.

The feedback device 651 is an example of a haptic output device, where a haptic output device is a device configured to output haptic effects, such as vibrotactile haptic effects, electrostatic friction haptic effects, or deformation haptic effects, in response to a drive signal. In alternate embodiments, the feedback device 651 can be replaced by some other type of haptic output device. Further, in other alternate embodiments, computing device 600 may not include an actuator, and a separate device from the computing device 600 includes an actuator, or other haptic output device, that generates the haptic effects, and computing device 600 sends generated haptic signals to that device through a communication device.

The display 640 is an output device configured to present information in a visual form. In particular, the display 640 may present graphical user interface ("GUI") elements, text, images, video, notifications, virtual buttons, virtual keyboards, messaging data, Internet content, device status, time, date, calendar data, preferences, map information, location information, and any other information that is capable of being presented in a visual form. In some configurations, the display 640 is a liquid crystal display ("LCD") utilizing any active or passive matrix technology and any backlighting technology (if used). In some configurations, the display 640 is an organic light emitting diode ("OLED") display. Other display types are contemplated.

The touchscreen 642, also referred to herein as a "touch-enabled screen," is an input device configured to detect the presence and location of a touch. The touchscreen 642 may be a resistive touchscreen, a capacitive touchscreen, a surface acoustic wave touchscreen, an infrared touchscreen, an optical imaging touchscreen, a dispersive signal touchscreen, an acoustic pulse recognition touchscreen, or may utilize any other touchscreen technology.

In some configurations, the touchscreen 642 is incorporated on top of the display 640 as a transparent layer to enable a user to use one or more touches to interact with objects or other information presented on the display 640. In other configurations, the touchscreen 642 is a touch pad incorporated on a surface of the computing device that does not include the display 640. For example, the computing device may have a touchscreen incorporated on top of the display 640 and a touch pad on a surface opposite the display 640.

In some configurations, the touchscreen 642 is a single-touch touchscreen. In other configurations, the touchscreen 642 is a multi-touch touchscreen. In some configurations, the touchscreen 642 is configured to detect discrete touches, single touch gestures, and/or multi-touch gestures. These are collectively referred to herein as gestures for convenience. Several gestures will now be described. It should be understood that these gestures are illustrative and are not intended to limit the scope of the appended claims. Moreover, the described gestures, additional gestures, and/or alternative gestures may be implemented in software for use with the touchscreen 642. As such, a developer may create gestures that are specific to a particular application program.

In some configurations, the touchscreen 642 supports a tap gesture in which a user taps the touchscreen 642 once on an item presented on the display 640. The tap gesture may be used for various reasons including, but not limited to, opening or launching whatever the user taps. In some configurations, the touchscreen 642 supports a double tap gesture in which a user taps the touchscreen 642 twice on an item presented on the display 640. The double tap gesture may be used for various reasons including, but not limited to, zooming in or zooming out in stages. In some configurations, the touchscreen 642 supports a tap and hold gesture in which a user taps the touchscreen 642 and maintains contact for at least a pre-defined time. The tap and hold gesture may be used for various reasons including, but not limited to, opening a context-specific menu.

In some configurations, the touchscreen 642 supports a pan gesture in which a user places a finger on the touchscreen 642 and maintains contact with the touchscreen 642 while moving the finger on the touchscreen 642. The pan gesture may be used for various reasons including, but not limited to, moving through screens, images, or menus at a controlled rate. Multiple finger pan gestures are also contemplated. In some configurations, the touchscreen 642 supports a flick gesture in which a user swipes a finger in the direction the user wants the screen to move. The flick gesture may be used for various reasons including, but not limited to, scrolling horizontally or vertically through menus or pages. In some configurations, the touchscreen 642 supports a pinch and stretch gesture in which a user makes a pinching motion with two fingers (e.g., thumb and forefinger) on the touchscreen 642 or moves the two fingers apart. The pinch and stretch gesture may be used for various reasons including, but not limited to, zooming gradually in or out of a web site, map, or picture.

Although the above gestures have been described with reference to the use of one or more fingers for performing the gestures, other appendages such as toes or objects such as styluses may be used to interact with the touchscreen 642. As such, the above gestures should be understood as being illustrative and should not be construed as being limiting in any way.

The data I/O interface component 644 is configured to facilitate input of data to the computing device and output of data from the computing device. In some configurations, the data I/O interface component 644 includes a connector configured to provide wired connectivity between the computing device and a computer system, for example, for synchronization operation purposes. The connector may be a proprietary connector or a standardized connector such as USB, micro-USB, mini-USB, or the like. In some configurations, the connector is a dock connector for docking the computing device with another device such as a docking station, audio device (e.g., a digital music player), or video device.

The audio I/O interface component 646 is configured to provide audio input and/or output capabilities to the computing device. In some configurations, the audio I/O interface component 646 includes a microphone configured to collect audio signals. In some configurations, the audio I/O interface component 646 includes a headphone jack configured to provide connectivity for headphones or other external speakers. In some configurations, the audio I/O interface component 646 includes a speaker for the output of audio signals. In some configurations, the audio I/O interface component 646 includes an optical audio cable out.

The video I/O interface component 648 is configured to provide video input and/or output capabilities to the computing device. In some configurations, the video I/O interface component 648 includes a video connector configured to receive video as input from another device (e.g., a video media player such as a DVD or BLURAY player) or send video as output to another device (e.g., a monitor, a television, or some other external display). In some configurations, the video I/O interface component 648 includes a High-Definition Multimedia Interface ("HDMI"), mini-HDMI, micro-HDMI, DisplayPort, or proprietary connector to input/output video content. In some configurations, the video I/O interface component 648 or portions thereof is combined with the audio I/O interface component 646 or portions thereof.

The camera 650 can be configured to capture still images and/or video. The camera 650 may utilize a charge coupled device ("CCD") or a complementary metal oxide semiconductor ("CMOS") image sensor to capture images. In some configurations, the camera 650 includes a flash to aid in taking pictures in low-light environments. Settings for the camera 650 may be implemented as hardware or software buttons.

Although not illustrated on FIG. 6, one or more hardware buttons may also be included in the computing device architecture 600. The hardware buttons may be used for controlling some operational aspect of the computing device. The hardware buttons may be dedicated buttons or multi-use buttons. The hardware buttons may be mechanical or sensor-based.

The illustrated power components 612 include one or more batteries 652, which can be connected to a battery gauge 654. The batteries 652 may be rechargeable or disposable. Rechargeable battery types include, but are not limited to, lithium polymer, lithium ion, nickel cadmium, and nickel metal hydride. Each of the batteries 652 may be made of one or more cells.

The battery gauge 654 can be configured to measure battery parameters such as current, voltage, and temperature. In some configurations, the battery gauge 654 is configured to measure the effect of a battery's discharge rate, temperature, age and other factors to predict remaining life within a certain percentage of error. In some configurations, the battery gauge 654 provides measurements to an application program that is configured to utilize the measurements to present useful power management data to a user. Power management data may include one or more of a percentage of battery used, a percentage of battery remaining, a battery condition, a remaining time, a remaining capacity (e.g., in watt hours), a current draw, and a voltage.

The power components 612 may also include a power connector, which may be combined with one or more of the aforementioned I/O components 610. The power components 612 may interface with an external power system or charging equipment via an I/O component.

Example Clauses

The disclosure presented herein encompasses the subject matter set forth in the following clauses.

Clause 1. A printed circuit board (PCB) apparatus, comprising: a plurality of PCB layers; an electrical component interface disposed on at least one of the plurality of PCB layers; and at least one vibration damping layer disposed between the plurality PCB layers.

Clause 2. The PCB apparatus according to clause 1, wherein the electrical component interface comprises a plurality of electrical contacts for receiving electrical terminals associated with an electrical component, the at least one vibration damping layer disposed below the plurality of electrical contacts.

Clause 3. The PCB apparatus according to clause 2, wherein the at least one vibration damping layer disposed below the plurality of electrical contacts has a damping layer portion that at least partially overlaps an electrical contact portion associated with at least one of the plurality of electrical contacts.

Clause 4. The PCB apparatus according to clause 2, wherein the at least one vibration damping layer disposed below the plurality of electrical contacts has a damping layer portion that overlaps an electrical contact portion associated with a first electrical contact of the plurality of electrical contacts and an electrical contact portion associated with a second electrical contact of the plurality of electrical contacts.

Clause 5. The PCB apparatus according to at least one of clauses 1-4, wherein the at least one vibration damping layer is a polymer layer.

Clause 6. The PCB apparatus according to clause 5, wherein the polymer layer comprises at least one of silicone, polypropylene, and polyurethane.

Clause 7. The PCB apparatus according to at least one of clauses 1-6, wherein the at least one vibration damping layer comprises a woven fiber cloth impregnated with resin.

Clause 8. The PCB apparatus according to at least one of clauses 1-7, wherein the at least one vibration damping layer comprises resin including continuous or discontinuous fibers.

Clause 9. A printed circuit board (PCB) apparatus, comprising: a plurality of PCB layers; a first electrical component interface and a second electrical component interface disposed on a surface of a layer of the plurality of PCB layers; an electrical component having a first terminal and a second terminal, the first terminal coupled to the first electrical component interface and the second terminal coupled to the second electrical component interface; and a vibration damping layer disposed between the plurality of PCB layers and at least partially below the electrical component, the vibration damping layer to absorb vibrations in one or more of the plurality PCB layers, the vibrations caused by the electrical component when a voltage is applied thereto.

Clause 10. The PCB apparatus according to clause 9, wherein the electrical component is a capacitor.

Clause 11. The PCB apparatus according to clause 10, wherein the capacitor is a multilayer ceramic capacitor comprising at least one or more materials that produce an oscillating piezoelectric force when the voltage is applied to the capacitor, the oscillating piezoelectric force causing the vibrations in the one or more of the plurality of PCB layers.

Clause 12. The PCB apparatus according to at least one of clauses 9-11, wherein the vibration damping layer is disposed below the first terminal, the second terminal and the electrical component.

Clause 13. The PCB apparatus according to at least one of clauses 9-12, wherein the vibration damping layer is a polymer layer.

Clause 14. The PCB apparatus according to clause 13, wherein the polymer layer comprises at least one of silicone, polypropylene, and polyurethane.

Clause 15. The PCB apparatus according to at least one of clauses 9-14, wherein the vibration damping layer comprises resin including continuous or discontinuous fibers.

Clause 16. A method, comprising: providing a first printed circuit board (PCB) layer; providing a vibration damping layer over at least a portion of a surface of the first PCB layer; providing a second PCB layer over the vibration damping layer and the first printed circuit board layer; and disposing an electrical component interface on a surface of the second PCB layer, the electrical component interface to electrically couple to an electrical component, wherein the vibration damping layer is disposed to absorb vibrations in one or more of the first and second PCB layers.

Clause 17. The method according to clause 16, wherein the vibrations in the one or more of the first and second PCB layers are caused by oscillations of the electrical component when a voltage is applied thereto.

Clause 18. The method according to at least one of clauses 16-17, wherein a damping layer portion of the vibration damping layer at least partially overlaps an electrical component interface portion of the electrical component interface on the surface of the second PCB layer.

Clause 19. The method according to at least one of clauses 16-18, further comprising providing a third PCB layer, the third PCB layer disposed below the first PCB layer, and providing another vibration damping layer over the third PCB layer, wherein the another vibration damping layer is disposed between the first PCB layer and the second PCB layer.

Clause 20. The method according to clause 19, wherein the vibration damping layer and the another vibration damping layer are offset from one another.

Although the techniques have been described in language specific to structural features and/or methodological acts, it is to be understood that the appended claims are not necessarily limited to the features or acts described. Rather, the features and acts are described as example implementations of such techniques.

The implementations described herein address the technical need to provide a PCB that absorbs vibrations generated by electrical components coupled to the PCB. Such vibrations may cause the PCB to vibrate. The vibrations associated with the PCB may be audible to a user of a computing device incorporating the PCB. Such audible vibrations may create an undesirable user experience associated with operating the computing device incorporating the PCB. To address at least this technical need, the implementations described herein provide a PCB that incorporates at least one vibration damping layer. The at least one vibration damping layer is functional to absorb some or all of the vibrations generated by electrical components coupled to the PCB and conveyed to the PCB. Other technical benefits not specifically identified herein can also be realized through implementations of the disclosed technologies.

The operations of the example methods are illustrated in individual blocks and summarized with reference to those blocks. The methods are illustrated as logical flows of blocks, each block of which can represent one or more operations that can be implemented in hardware, software, or a combination thereof. In the context of software, the operations represent computer-executable instructions stored on one or more computer-readable media that, when executed by one or more processors, enable the one or more processors to perform the recited operations. Generally, computer-executable instructions include routines, programs, objects, modules, components, data structures, and the like that perform particular functions or implement particular abstract data types. The order in which the operations are described is not intended to be construed as a limitation, and any number of the described operations can be executed in any order, combined in any order, subdivided into multiple sub-operations, and/or executed in parallel to implement the described processes. The described processes can be performed by resources associated with one or more device(s) such as one or more internal or external CPUs or GPUs, and/or one or more pieces of hardware logic such as FPGAs, DSPs, or other types of accelerators.

All of the methods and processes described above may be embodied in, and fully automated via, software code modules executed by one or more general purpose computers or processors. The code modules may be stored in any type of computer-readable storage medium or other computer storage device. Some or all of the methods may alternatively be embodied in specialized computer hardware.

Conditional language such as, among others, "can," "could," "might" or "may," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example. Conjunctive language such as the phrase "at least one of X, Y or Z," unless specifically stated otherwise, is to be understood to present that an item, term, etc. may be either X, Y, or Z, or a combination thereof.

Any routine descriptions, elements or blocks in the flow diagrams described herein and/or depicted in the attached figures should be understood as potentially representing modules, segments, or portions of code that include one or more executable instructions for implementing specific logical functions or elements in the routine. Alternate implementations are included within the scope of the examples described herein in which elements or functions may be deleted, or executed out of order from that shown or discussed, including substantially synchronously or in reverse order, depending on the functionality involved as would be understood by those skilled in the art. It should be emphasized that many variations and modifications may be made to the above-described examples, the elements of which are to be understood as being among other acceptable examples. All such modifications and variations are intended to be included herein within the scope of this disclosure and protected by the following claims.

What is claimed is:

1. A printed circuit board (PCB) apparatus, comprising:
a plurality of PCB layers;
an electrical component interface disposed on at least one of the plurality of PCB layers, the electrical component interface comprising a plurality of electrical contacts for receiving electrical terminals associated with an electrical component; and
at least one vibration damping layer disposed between the plurality PCB layers and below the plurality of electrical contacts, the at least one vibration damping layer having a damping layer portion that overlaps an electrical contact portion associated with a first electrical contact of the plurality of electrical contacts and an electrical contact portion associated with a second electrical contact of the plurality of electrical contacts.

2. The PCB apparatus according to claim 1, wherein the at least one vibration damping layer is a polymer layer.

3. The PCB apparatus according to claim 2, wherein the polymer layer comprises at least one of silicone, polypropylene, and polyurethane.

4. The PCB apparatus according to claim 1, wherein the at least one vibration damping layer comprises a woven fiber cloth impregnated with resin.

5. The PCB apparatus according to claim 1, wherein the at least one vibration damping layer comprises resin including continuous or discontinuous fibers.

6. A printed circuit board (PCB) apparatus, comprising:
a plurality of PCB layers;
a first electrical component interface and a second electrical component interface disposed on a surface of a layer of the plurality of PCB layers;
an electrical component having a first terminal and a second terminal, the first terminal coupled to the first electrical component interface and the second terminal coupled to the second electrical component interface; and
a vibration damping layer disposed between the plurality of PCB layers and at least partially below the electrical component, the vibration damping layer having a damping layer portion that overlaps a portion of the first electrical component interface and a portion of the second electrical component interface, the vibration damping layer to absorb vibrations in one or more of the plurality PCB layers, the vibrations caused by the electrical component when a voltage is applied thereto.

7. The PCB apparatus according to claim 6, wherein the electrical component is a capacitor.

8. The PCB apparatus according to claim 7, wherein the capacitor is a multilayer ceramic capacitor comprising at least one or more materials that produce an oscillating piezoelectric force when the voltage is applied to the capacitor, the oscillating piezoelectric force causing the vibrations in the one or more of the plurality of PCB layers.

9. The PCB apparatus according to claim 6, wherein the vibration damping layer is disposed below the first terminal, the second terminal and the electrical component.

10. The PCB apparatus according to claim 6, wherein the vibration damping layer is a polymer layer.

11. The PCB apparatus according to claim 10, wherein the polymer layer comprises at least one of silicone, polypropylene, and polyurethane.

12. The PCB apparatus according to claim 6, wherein the vibration damping layer comprises resin including continuous or discontinuous fibers.

13. A method, comprising:
providing a first printed circuit board (PCB) layer;
providing a vibration damping layer over at least a portion of a surface of the first PCB layer;
providing a second PCB layer over the vibration damping layer and the first printed circuit board layer; and disposing an electrical component interface on a surface of the second PCB layer, the electrical component interface to electrically couple to an electrical component, the electrical component interface comprising a plurality of electrical contacts for receiving electrical terminals associated with an electrical component, wherein the vibration damping layer is disposed to absorb vibrations in one or more of the first and second PCB layers, the vibration damping layer disposed below the plurality of electrical contacts, the vibration damping layer having a damping layer portion that overlaps an electrical contact portion associated with a first electrical contact of the plurality of electrical contacts and an electrical contact portion associated with a second electrical contact of the plurality of electrical contacts.

14. The method according to claim 13, wherein the vibrations in the one or more of the first and second PCB layers are caused by oscillations of the electrical component when a voltage is applied thereto.

15. The method according to claim 13, further comprising providing a third PCB layer, the third PCB layer disposed below the first PCB layer, and providing another vibration damping layer over the third PCB layer, wherein the another vibration damping layer is disposed between the first PCB layer and the second PCB layer.

16. The method according to claim 15, wherein the vibration damping layer and the another vibration damping layer are offset from one another.

* * * * *